United States Patent
Zelner et al.

(10) Patent No.: US 10,297,658 B2
(45) Date of Patent: May 21, 2019

(54) METHOD AND APPARATUS FOR A THIN FILM DIELECTRIC STACK

(71) Applicant: BLACKBERRY LIMITED, Waterloo (CA)

(72) Inventors: Marina Zelner, Burlington (CA); Andrew Vladimir Claude Cervin, Oakville (CA); Edward Horne, Burlington (CA)

(73) Assignee: BLACKBERRY LIMITED, Waterloo (CA)

( * ) Notice: Subject to any disclaimer, the term of this patent is extended or adjusted under 35 U.S.C. 154(b) by 10 days.

(21) Appl. No.: 15/184,081

(22) Filed: Jun. 16, 2016

(65) Prior Publication Data

US 2017/0365656 A1     Dec. 21, 2017

(51) Int. Cl.
  *H01L 49/02* (2006.01)
  *H01G 4/12* (2006.01)
  *H01G 4/33* (2006.01)

(52) U.S. Cl.
  CPC ........... *H01L 28/40* (2013.01); *H01G 4/1227* (2013.01); *H01G 4/1245* (2013.01); *H01G 4/1254* (2013.01); *H01G 4/33* (2013.01); *H01L 28/56* (2013.01); *H01L 2224/0401* (2013.01); *H01L 2224/10126* (2013.01); *H01L 2224/13144* (2013.01)

(58) Field of Classification Search
  None
  See application file for complete search history.

(56) References Cited

U.S. PATENT DOCUMENTS

| | | |
|---|---|---|
| 5,745,335 A | 4/1998 | Watt |
| 5,811,181 A | 9/1998 | Kijima et al. |
| 6,194,753 B1 | 2/2001 | Seon et al. |
| 6,407,929 B1 | 6/2002 | Hale et al. |
| 6,440,591 B1 | 8/2002 | Matsunaga et al. |
| 6,500,754 B1 | 12/2002 | Erb et al. |
| 6,777,776 B2 | 8/2004 | Hieda |
| 6,909,589 B2 | 6/2005 | Huff |
| 7,224,040 B2 | 5/2007 | Koutsaroff |

(Continued)

FOREIGN PATENT DOCUMENTS

| | | |
|---|---|---|
| CA | 2968643 | 12/2017 |
| EP | 3258472 | 12/2017 |

OTHER PUBLICATIONS

"International Search Report for PCT/CA2008/00906", dated Aug. 28, 2008, 3 pages.

(Continued)

*Primary Examiner* — Charles D Garber
*Assistant Examiner* — Xiaoming Liu
(74) *Attorney, Agent, or Firm* — Guntin & Gust, PLC; Mark Wilinski (57) ABSTRACT

A system that incorporates teachings of the subject disclosure may include, for example, a thin film capacitor having a substrate, a first electrode layer on the substrate, a first dielectric layer on the first electrode layer where the first dielectric layer has a columnar-oriented grain structure, a group of second dielectric layers stacked on the first dielectric layer where each of the group of second dielectric layers has a randomly-oriented grain structure, and a second electrode layer on the group of second dielectric layers. Other embodiments are disclosed.

18 Claims, 4 Drawing Sheets

(56) References Cited

U.S. PATENT DOCUMENTS

| | | |
|---|---|---|
| 8,154,850 B2 | 4/2012 | Zelner et al. |
| 8,467,169 B2 | 6/2013 | Oakes et al. |
| 8,693,162 B2 | 4/2014 | Capanu et al. |
| 8,867,189 B2 | 10/2014 | Zelner et al. |
| 2002/0132374 A1* | 9/2002 | Basceri ................. C23C 16/409 438/3 |
| 2003/0133250 A1 | 7/2003 | Norga et al. |
| 2003/0169560 A1 | 9/2003 | Welsch et al. |
| 2004/0175585 A1 | 9/2004 | Zou et al. |
| 2005/0064605 A1 | 3/2005 | Lee et al. |
| 2006/0273366 A1 | 12/2006 | Ko et al. |
| 2008/0278887 A1* | 11/2008 | Zelner .................. H01G 4/1227 361/313 |
| 2014/0042590 A1* | 2/2014 | Chen ....................... H01L 28/60 257/532 |
| 2014/0272465 A1 | 9/2014 | Lienhart et al. |
| 2014/0339961 A1* | 11/2014 | Maejima ............. H01L 41/0805 310/358 |
| 2016/0268048 A1 | 9/2016 | Zelner |

OTHER PUBLICATIONS

Supplementary European Search Report for EP 17176281.8 dated Aug. 3, 2017.

Xin, Yan et al., "Structures and Tunability of Ba 0.5 Sr 0.5 TiO 3 /Bi 1.5 Zn 1.0 Nb 1.5 0 7 Multilayer Thin Films Grown on Pt/Al 2 0 3 Substrates", Ferroelectrics, vol. 384 (1), Jun. 25, 2009, 98-105.

\* cited by examiner

METHOD AND APPARATUS FOR A THIN FILM DIELECTRIC STACK

FIELD OF THE DISCLOSURE

This present invention relates, in general, to a thin film dielectric stack, and more particularly, to systems of and methods for manufacturing a thin film multilayer tunable dielectric stack.

BACKGROUND

Ferroelectric capacitors have various uses in RF systems including as voltage-tunable devices. Some benefits of ferroelectric capacitors are small size, integration of different values and functions of capacitance, and low cost. Applications for ferroelectric capacitors may include tunable filters, voltage controlled oscillators, tunable phase shifters, tunable matching networks, low-impedance power supplies, decoupling high-frequency signals at an IC bonding pad, or others.

Integrated circuits including ferroelectric capacitors may, for example, be used in portable electronics for low-power wireless communication (e.g., cellular phones, pagers, PDAs, and so forth), directional antenna systems, high clock-rate microphones, miniature DC to DC converters, or other devices.

The fabrication of tunable ferroelectric capacitors can sometimes lead to undesired conditions. For example, a hillock that forms on a bottom electrode can cause defects and deformations resulting in a reduction in breakdown voltage of the dielectric film. As another example, vertical dendrite growth can cause capacitor failure in the field during use.

Current techniques of depositing high-K tunable dielectric materials can have limited throughput and thus high capital and manufacturing costs. Current techniques can also have limitations in flexibility of composition that may not allow the best optimization or improvement of RF and DC properties of the dielectric stack.

BRIEF DESCRIPTION OF THE DRAWINGS

Reference will now be made to the accompanying drawings, which are not necessarily drawn to scale, and wherein.

DETAILED DESCRIPTION

The subject disclosure describes, among other things, illustrative embodiments of a thin film capacitor and a method of fabricating a thin film capacitor which has multiple stacked dielectric layers. The stacked dielectric layers provide for a change in grain structures in different dielectric layers.

One or more of the exemplary embodiments provide for a deposition of a thin sputtered buffer layer (e.g., doped Barium Strontium Titanate (BST)) on a conductive electrode plus the spin-deposition and anneal of one or more metal-organic (MOD) or sol-gel deposited layers. In one or more embodiments, an intermediate crystallization anneal may be performed once a final dielectric thickness is obtained and/or a final crystallization anneal may be performed after the dielectric/electrode stack has been formed. In one or more embodiments, a thin sputtered buffer layer is provided that can improve the voltage breakdown and hysteresis of the spin-deposited dielectric by several orders of magnitude relative to dielectrics spin-deposited directly on the electrode material and subsequently annealed.

One or more of the exemplary embodiments can provide a low-cost method of manufacturing by allowing the use of conventional high-throughput atmospheric diffusion tubes and MOD or sol-gel spin deposition rather than single-wafer high-temperature sputter-deposition with limited throughput and high capital cost and cost-of-ownership. In one or more embodiments, the sputter-deposition of the thin low-temperature buffer layer can be quick and can have minimal time lost for temperature ramping and thus can make better use of the high-cost sputter deposition equipment. One or more of the exemplary embodiments allows for different compositions for each layer in the dielectric stack that enables optimization, improvement, or selectivity of the RF and DC properties of the final device.

One or more of the exemplary embodiments can give a much lower cost method of fabricating high-quality tunable dielectric materials and/or can give much better flexibility in composition of the dielectric stack.

One or more of the exemplary embodiments can reduce or eliminate dendrite formation. In one or more embodiments, the first thin dense layer of dielectric is deposited at the temperature lower than stress relief temperature of the electrode, which can reduce or eliminate hillock formation on the electrode(s) resulting in high breakdown voltage. The systems and methods described herein provide a composite high-k thin film stack which improves the time-dependent dielectric breakdown of the thin film capacitor. Other embodiments are described by the subject disclosure.

One or more features and/or process steps described in U.S. Pat. Nos. 8,154,850, 8,693,162, 8,664,704, 5,745,335, U.S. Patent Publication No. 20140216921, and U.S. application Ser. No. 14/642,222 can be utilized in place of or in addition to one or more features and/or process steps described herein with respect to the exemplary embodiments. The disclosures of U.S. Pat. Nos. 8,154,850, 8,693,162, 8,664,704, 5,745,335, U.S. Patent Publication No. 20140216921, and U.S. application Ser. No. 14/642,222 are incorporated herein by reference in their entirety.

One embodiment of the subject disclosure is a method for fabricating a thin film capacitor. The method can include depositing a first dielectric layer on a first electrode layer utilizing a first process that is performed at a first temperature and that forms a columnar vertically-oriented grain structure for the first dielectric layer. The method includes depositing a second dielectric layer on the first dielectric layer utilizing a second process that forms a randomly-oriented grain structure for the second dielectric layer. The method includes performing a first annealing at a second temperature that is higher than the first temperature and repeating the depositing and first annealing of the second dielectric layer until a desired thickness is obtained. The method includes performing a crystallization annealing at a third temperature and depositing a second electrode layer on the second dielectric layer. The method includes performing a final crystallization annealing at a fourth temperature to form the thin film capacitor, where the fourth temperature is higher than the first, second and third temperatures.

One embodiment of the subject disclosure is a thin film capacitor including a substrate, a first electrode layer on the substrate, and a first dielectric layer on the first electrode layer, where the first dielectric layer has a columnar vertically-oriented grain structure. The thin film capacitor also includes a group of second dielectric layers stacked on the first dielectric layer where each of the group of second dielectric layers has a randomly-oriented grain structure and where at least one of the group of second dielectric layers is formed from a different material from at least one other of the group of second dielectric layers, and a second electrode layer on the group of second dielectric layers.

One embodiment of the subject disclosure is a method for fabricating a thin film capacitor. The method includes depositing a first dielectric layer on a first electrode layer utilizing a sputtering deposition that forms a columnar-oriented grain structure for the first dielectric layer. The method includes depositing a group of second dielectric layers stacked on the first dielectric layer utilizing a second process that forms a randomly-oriented grain structure for each of the group of second dielectric layers, where a first annealing is performed after deposition of each of the group of second dielectric layers. The method includes performing a crystallization annealing after a desired thickness of the group of second dielectric layers is obtained and depositing a second electrode layer on the group of second dielectric layers. The method includes performing a final crystallization annealing to form the thin film capacitor.

Figure 1:
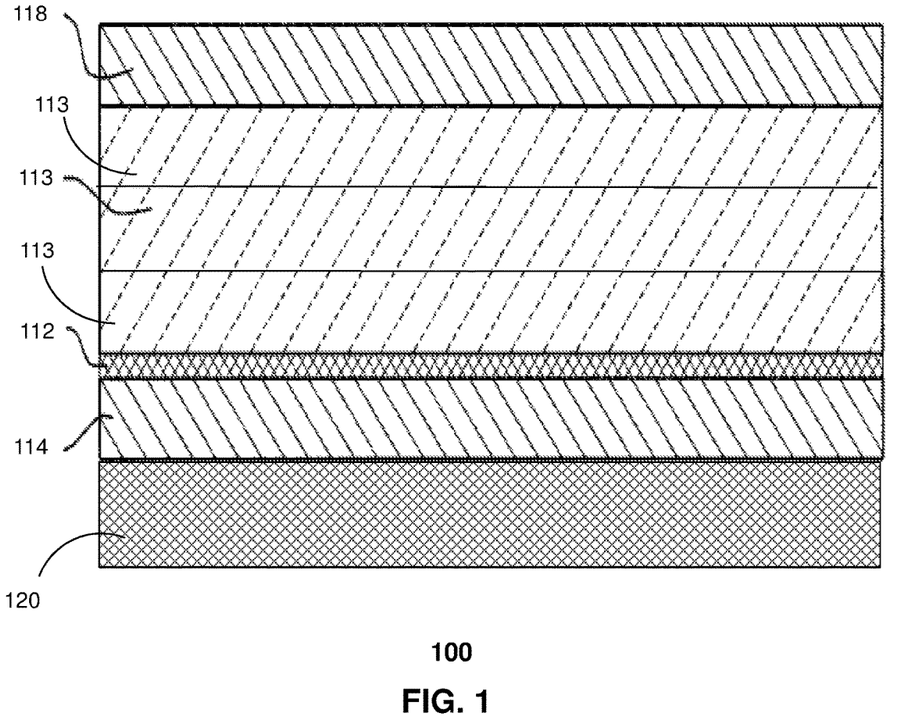
FIG. 1 illustrates an exemplary embodiment of a thin film capacitor having multiple dielectric layers.

Referring to FIG. 1, a ferroelectric capacitor 100 is illustrated that can improve time-dependent dielectric breakdown. In one or more embodiments, capacitor 100 can reduce or eliminate dendrite formation, and/or reduce or eliminate hillock formation along electrodes. Capacitor 100 can include a first dielectric layer 112, and one or more second dielectric layers 113 (three of which are shown). In one or more embodiments, the dielectric layers 112 and 113 can be formed directly on each other. The dielectric layers 112, 113 can be formed between electrode layer 114 and electrode layer 118.

In one or more embodiments, the first dielectric layer 112 can be formed of Barium Strontium Titanate (BST). In other embodiments, the first dielectric layer 112 can be formed of other materials, such as Strontium Bismuth Tantalate (SBT), Lead Zirconate Titanate (PZT), Lead Lanthanum Zirconate Titanate (PLZT), any other perovskite or pyrochlore phase ferroelectric film, or a combination thereof.

In one or more embodiments, the first dielectric layer 112 can be formed by a process and/or formed from material(s) that enable the first dielectric layer to suppress formation of hillocks at the electrode-dielectric interface between layers 112 and 114. The first dielectric layer 112 can be formed by a process and/or formed from material(s) that provide for a particular grain habit in the first dielectric layer, such as vertically-oriented columnar grain structure. For example, the first dielectric layer 112 can be formed as a thin high density dielectric buffer layer using a sputter-deposition technique at a particular temperature. In one or more embodiments, the sputter deposit of first dielectric layer 112 can be performed at a temperature of at least 20 degrees Celsius lower than the stress relief temperature of the electrode 114. In one or more embodiments, the first dielectric layer 112 can have a thickness between 50 and 500 Angstroms (A).

In one or more embodiments, the second dielectric layers 113 can be a group of stacked dielectric layers that are formed from the same material or that are formed (in whole or in part) from different materials. As an example, the second dielectric layers 113 can be a tunable high-K dielectric with randomly oriented grains deposited on the first dielectric layer 112 using techniques such as MOD or sol-gel deposition. For instance, spin-deposition or misted deposition can be utilized for depositing the second dielectric layers 113. However, other deposition techniques may also be used, where they allow for the randomly oriented grain structure of the second dielectric layers 113.

In one or more embodiments, the composition of the second dielectric layers 113 can be the same or different than the composition of the first dielectric layer 112. For example, the materials utilized for the second dielectric layers 113 can be selected to improve or optimize RF and DC properties of the resulting device. For instance, materials can be selected for the second dielectric layers 113 to improve or optimize one or more of material losses, capacitance-voltage (CV) response or curve, maximum capacitance tuning ratio, reliability and electrostrictive resonance cancellation.

In one or more embodiments, densification of the second dielectric layer 113 can be performed by annealing in $O_2$ or an $O_2$/Carrier gas mixture at a temperature higher than the deposition temperature of the first dielectric layer 112 but lower than a final crystallization temperature of the capacitor stack as will be described later. The deposition and anneal of the group of second dielectric layers 113 of tunable high-K dielectric can be repeated until the desired dielectric stack thickness is achieved.

In one or more embodiments, the composition of each layer of the group of dielectric layers 113 can be the same or can be different from one or more other layers of the group of dielectric layers 113 in order to achieve improved or optimal RF and DC properties. In one embodiment, the different compositions can be deposited on a single spin track by having multiple dispense pumps for the solution. After the annealing, the resulting dielectric stack can be amorphous and about 70% densified. Final density can be achieved after a final crystallization of the dielectric/electrode stack.

In one or more embodiments, one or more of the group of second dielectric layers 113 can be formed from various materials including BST, SBT, PZT, PLZT, any other perovskite or pyrochlore phase ferroelectric film, or a combination thereof. In one or more embodiments, the group of second dielectric layers 113 can be formed by a process and/or formed from material(s) that suppress dendrite formation and/or distort the orientation of crystalline columnarity of the first dielectric layer 112 while providing an interruption in vertically oriented grain boundaries of the capacitor resulting in an improvement in the time-dependent dielectric breakdown behavior of the capacitor. In one or more embodiments, one or more of the group of second dielectric layers 113 can be formed by a process and/or formed from material(s) that provide for a randomly-oriented grain structure in the particular layer.

In one or more embodiments, the electrodes 114, 118 can be formed of various materials including platinum, platinum alloy, iridium either solely or in combination with iridium oxide, ruthenium oxide, or Strontium Ruthenium Oxide (SRO), any metal or conductive oxide or any combination of these materials. The electrodes 114, 118 can be formed from other conductive materials, including non-metal conductive materials. The electrodes 114, 118 can be formed from the same material or can be formed from different materials. In one or more embodiments, the electrodes 114, 118 can be a conductive layer comprised of metals, conductive oxides or a combination thereof while the dielectric layer is comprised of a high K dielectric material.

In one or more embodiments, the capacitor structure 100 with multiple dielectric layers 112, 113 can be formed on a substrate 120. The substrate 120 can be formed of various materials including silicon, alumina (including glazed and zirconia toughened alumina (ZTA)), sapphire, silicon-on-sapphire (SOS), silicon carbide, magnesium silicate (including forsterite), any other type of insulating, semi-insulating or semi-conducting material, or any combinations thereof. Other layers can also be included in the capacitor 100 such as an insulating layer (e.g., $SiO_2$) and/or a hermetic insulating layer ($Si_3N_4$).

In one embodiment, the first and second dielectric layers 112, 113 can utilize a combination of an undoped BST and a doped BST formulation, or a combination of different ferroelectric materials to facilitate reducing space charge effects and/or improving a temperature dependence of the dielectric properties of the capacitor 100. In another embodiment, different layers of the group of second dielectric layers 113 can use doped and undoped BST materials.

In one embodiment, the thickness of the first dielectric layer 112 and/or the second dielectric layer(s) 113 can be selected so that they are thin enough to not adversely affect the operation of the capacitor 100 but thick enough to enable suppression of hillock formation, suppression of dendrite formation, and/or avoid or reduce charge trapping at the electrode-dielectric interface. As an example, the overall thickness of the combination of the first and second dielectric layer(s) 112, 113 can be less than 300 A or less than 800 A. In one embodiment, the thickness of the first dielectric layer 112 can be different from the thickness of one, some or all of the second dielectric layers 113. The thicknesses selected for the first dielectric layer 112 and/or second dielectric layer(s) can be based on various factors including one or more of the dielectric material(s) being utilized, the electrode material(s) being utilized, the desired properties of the capacitor, the desired size and/or shape of the capacitor, the operating environment of the capacitor, and so forth.

Figure 2:
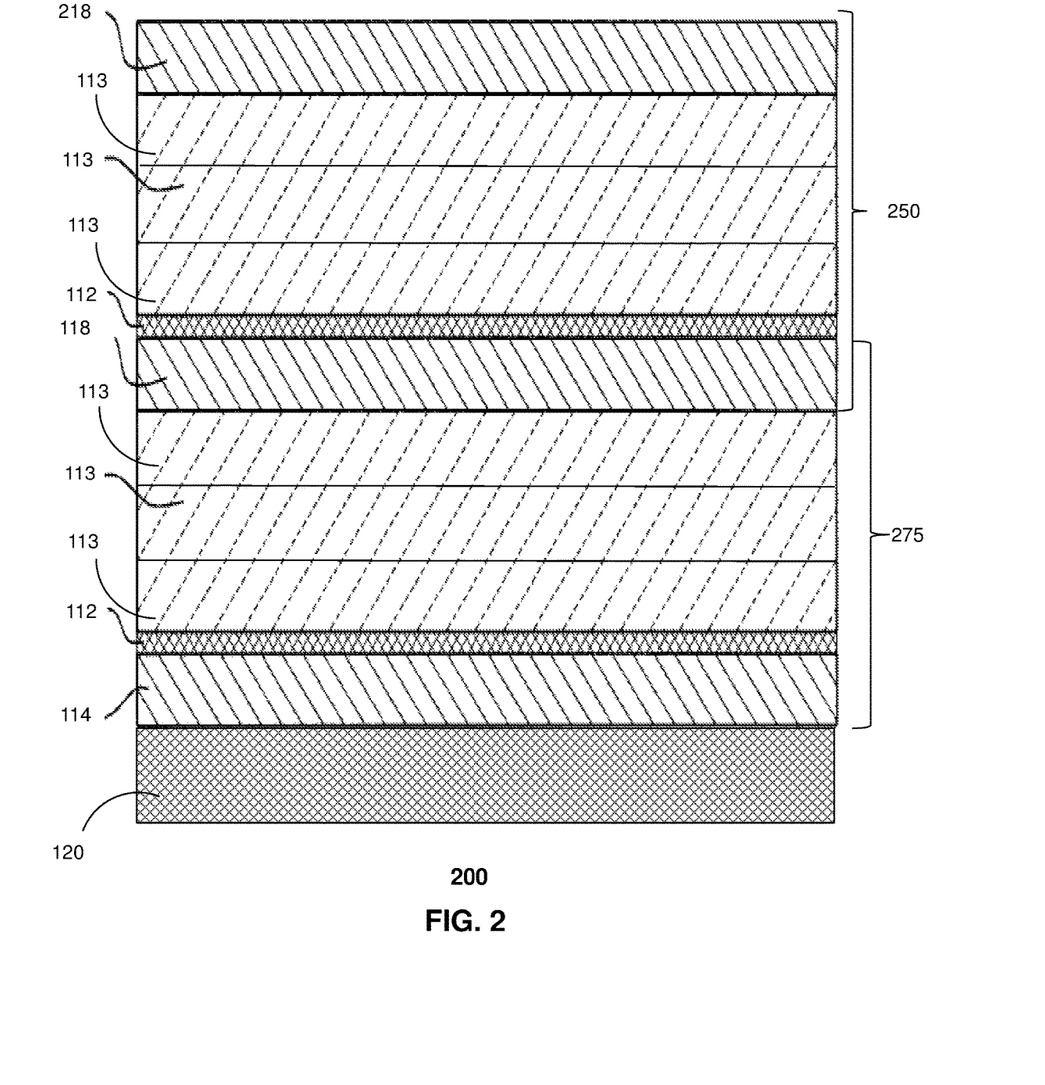
FIG. 2 illustrates another exemplary embodiment of a thin film capacitor having multiple dielectric layers.

Referring to FIG. 2, a ferroelectric capacitor 200 is illustrated that includes first dielectric layers 112, and groups of second dielectric layers 113 (in this example each group including three second dielectric layers). The dielectric layers 112, 113 as described above can be formed by a process, formed from material(s) and/or have particular crystal grain structures which provide desired properties to the capacitor 200, such as suppression of dendrite formation, suppression of hillock formation and/or improvement of time-dependent dielectric breakdown. Capacitor 200 illustrates first and second capacitors 250, 275 that are stacked together sharing a middle electrode 118 and further having a top electrode 218.

Capacitor 200 can have any number of stacked capacitors that are each formed from the dielectric layers 112, 113. Any number of sets of stacked dielectric layers 112, 113 can be utilized and various other connections can be implemented (not shown). In one embodiment, the sets of dielectric layers that each form capacitors 250, 275 can be the same or similar (e.g., having the same number of layers where corresponding layers in different sets have the same thickness, materials, and/or grain structure). In another embodiment, the sets of dielectric layers can have the same number of layers but corresponding layers in different sets can have the same or different thickness, materials, and/or grain structure). As an example, different capacitors stacked together may have different desired properties so that the thicknesses and/or materials forming the corresponding layers in different sets can be different. In another embodiment, the sets of dielectric layers can have different numbers of layers, such as a bottom capacitor having three second dielectric layers 113, a middle capacitor having five second dielectric layers 113, and a top capacitor having a single second dielectric layer 113.

In one embodiment, the fabrication of each capacitor of the sets of capacitors (e.g., capacitors 250, 275) can be the same or similar (e.g., using the same processes for each corresponding layer in the different sets). In another embodiment, the fabrication of each capacitor of the sets of capacitors can be different (e.g., using a different process for a corresponding layer in a different set such as using different annealing or deposition temperatures in different ones of the stacked capacitors 250, 275). The use of different processes to fabricate corresponding layers in different sets of capacitors can be based on various factors including desired properties of the different stacked capacitors (e.g., capacitors 250, 275).

Figure 3:
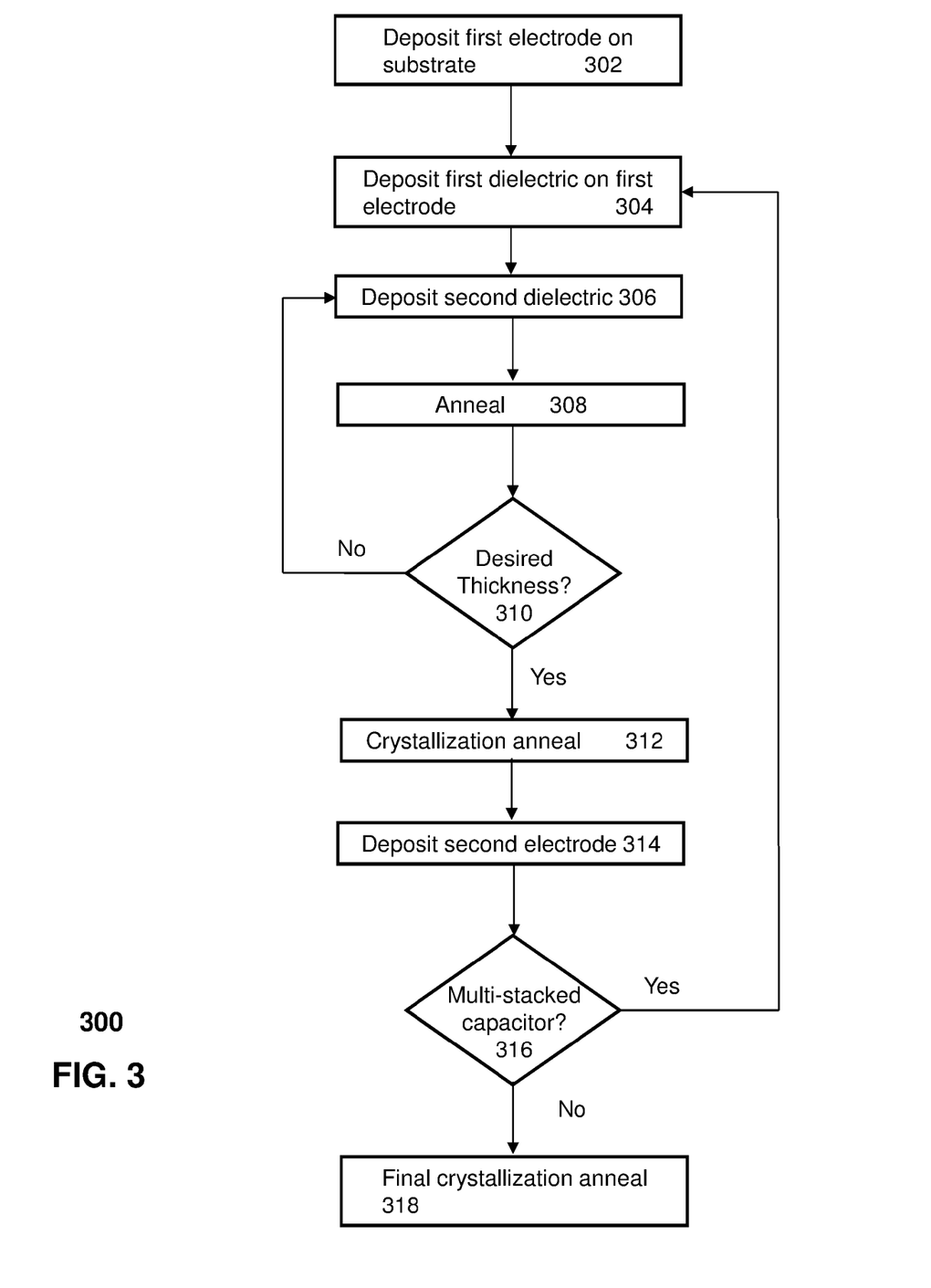
FIG. 3 illustrates an exemplary embodiment of a method of fabricating a thin film capacitor.

FIG. 3 depicts an illustrative method 300 for fabricating a multilayer capacitor structure. At 302, the first electrode layer 114 of conductive material may be deposited or otherwise formed. For example, the first electrode layer 114 may be deposited directly onto the substrate 120 or may be deposited onto the substrate that has previously had an insulating layer deposited thereon. The first electrode layer 114 can be formed of various materials including platinum, platinum alloy, iridium either solely or in combination with iridium oxide, ruthenium oxide, or SRO, any metal or conductive oxide, or any combination of these materials.

At 304, a first dielectric layer 112 of ferroelectric material can be deposited or otherwise formed on the first electrode layer 114. In one embodiment, the first dielectric layer 112 can be deposited directly onto the first electrode layer 114. In another embodiment, the first dielectric layer 112 can be deposited so as to cover an entire top surface of the first electrode layer 114. The first dielectric layer 112 can be formed of various materials including BST, SBT, BZN, PZT, PLZT, any other perovskite or pyrochlore phase ferroelectric film, or a combination thereof.

In one or more embodiments, the first dielectric layer 112 can have a thickness between 50 A and 500 A. However, other thicknesses can be utilized for the first dielectric layer 112, such as based on the type of dielectric material, the parameters for the capacitor being formed, and so forth. In one embodiment, the thickness of the first dielectric layer 112 can be selected so that it is thin enough to not adversely affect the operation of the capacitor but thick enough to enable suppression of hillock formation and/or avoid or reduce charge trapping.

The first dielectric layer 112 can be a layer that suppresses formation of hillocks along the surface of the first electrode layer 114. As an example, the first dielectric layer 112 can be deposited at a temperature which is low enough to prevent or reduce hillock formation. In one embodiment, a hillock temperature can be determined for the first electrode layer 114 where the hillock temperature corresponds to the temperature above which hillock formation is likely (e.g., has been observed during testing). In this embodiment, the deposition temperature for the first dielectric layer 112 can then be chosen to be below the hillock temperature.

In one embodiment, the first dielectric layer 112 can be deposited using a process that enables a columnar-oriented grain structure to be formed, such as via a sputtering process. In another embodiment for depositing the first dielectric layer 112, a sputtering process can be performed below the hillock temperature thereby preventing or reducing hillock formation while also reducing grain growth, as compared to a high-temperature sputtering process. In one embodiment, the first dielectric layer 112 can heal and planarize possible defects and roughness in the first electrode layer 114 when applied directly to the first electrode layer.

In one or more embodiments, the first dielectric layer 112 can be a thin high density dielectric buffer layer, which is sputter-deposited on the electrode layer 114 at a temperature at least 20 degrees lower than a stress relief temperature of the electrode layer, where the first dielectric layer 112 has a grain structure that is columnar.

At 306, a second dielectric layer 113 of ferroelectric material can be deposited or otherwise formed on the first dielectric layer 112. In one embodiment, the second dielectric layer 113 can be deposited directly onto the first dielectric layer 112. In another embodiment, the second dielectric layer 113 can be deposited so as to cover an entire top surface of the first dielectric layer 112. The second dielectric layer 113 can be formed of various materials including BST, SBT, BZN, PZT, PLZT, any other perovskite or pyrochlore phase ferroelectric film or a combination thereof.

In one or more embodiments the second dielectric layer 113 has a randomly oriented grain structure and is deposited on the first dielectric layer 112 by MOD or sol-gel deposition, such as spin-deposition or misted deposition. The composition of the second dielectric layers 113 can be the same or different than the first dielectric layer 112 in order to improve or optimize RF and DC properties of the fabricated capacitor.

In one or more embodiments at 308, densification of the second dielectric layers 113 can be performed by an annealing process. For example, the annealing can be performed in $O_2$ or an $O_2$/Carrier gas mixture. In one or more embodiments, this annealing can be at a temperature higher than the deposition temperature of the first dielectric layer 112. In another embodiment, this annealing can be at a temperature higher that is lower than a final crystallization temperature of the fabricated capacitor.

At 310, the deposition and annealing of the second dielectric layer 113 of tunable high-K dielectric can be repeated until a desired dielectric stack thickness is achieved. In one embodiment, the composition of each layer of second dielectric layer 113 can be the same. In another embodiment, one or more layers of the second dielectric layers 113 can have a different composition than one or more other layers of the second dielectric layers. Various configurations of the same or different materials for the group of dielectric layers 113 can be used, such as alternating layers of different compositions, top and bottom of the group of second dielectric layers 113 having the same composition, gradually adjusting an amount of doping in each adjacent ones of the group of second dielectric layers, and so forth.

The use of the same materials or different materials for the group of dielectric layers 113 can be selected to achieve improved, optimal or selected RF and DC properties. In one or more embodiments, the different compositions can be deposited on a single spin track by having multiple dispense pumps. After the annealing, the resulting dielectric stack can be amorphous and about 70% densified. Final density can be achieved after a final crystallization of the dielectric/electrode stack.

The group of second dielectric layers 113 can have an overall thickness between 500 A and 50000 A. However, other overall thicknesses can be utilized for the second dielectric layers 113, such as based on the type of dielectric material, the parameters for the capacitor being formed, and so forth. In one embodiment, the thickness of the second dielectric layers 113 can be selected so that they are thin enough to not adversely affect the operation of the capacitor but thick enough to enable suppression of dendrite formation and/or improvement of the time-dependent dielectric breakdown of the capacitor. In one or more embodiments, the second dielectric layers 113 can have the same or different thicknesses. For example where there are three second dielectric layers 113, a top and bottom second dielectric layer 113 can have the same thickness which is different from the thickness of a middle second dielectric layer.

The second dielectric layers 113 can be layers with randomly oriented grains providing tuning interrupting the vertically oriented grain boundaries of the first dielectric layer 112 of the capacitor resulting in an improvement in the time-dependent dielectric breakdown behavior of the capacitor. As an example, the second dielectric layer 113 can be deposited utilizing a process that forms a randomly-oriented grain structure in the second dielectric layer. For instance, the second dielectric layers 113 can be deposited utilizing a MOD or sol-gel process, such as spin-on deposition or misted deposition. In one embodiment, the deposition of the second dielectric layer 113 can be performed at a low temperature, such as room temperature. In another embodiment, the second dielectric layer 113 can be deposited using room temperature spin-coating deposition process of amorphous film with a following high temperature crystallization anneal.

In one embodiment, densification thermal processing can be applied after the deposition of the second dielectric layer 113, such as hot plate bakes, oven bakes, and/or vacuum oven bakes. After the initial bake the dielectric film remains amorphous with 50-70% increase in film density.

The following crystallization anneal could be an atmospheric furnace anneal, a furnace anneal in reactive ambients, a rapid thermal process, or a vacuum anneal. The temperature profile of the high temperature crystallization film should be adjusted to achieve full crystallization of the film that was amorphous as-deposited. In one embodiment, the second dielectric layer 113 can be deposited using other processes that enable a randomly-oriented grain structure to be formed. The other process could be the misted deposition or LPCVD.

At 312, when the overall desired thickness of the second dielectric layers 113 is achieved, a first crystallization anneal can be performed. In one or more embodiments, the first crystallization anneal can be performed at a temperature of 50-100 C lower than a final crystallization anneal. In one or more embodiments, the grain structure of the second dielectric layers 113 of the capacitor stack after this first crystallization anneal can be microcrystalline and can have the same phase volume as in the previous step. In one embodiment, the thin film at this stage has 90% of its final density. In one or more embodiments, the spin and anneal processes and equipment can be low-cost high-throughput processes that provide a reduced or minimum cost for the fabricated capacitor. For example, a conventional furnace tube will take a load of 50 to 250 wafers for a single anneal step, allowing multiple batches to be processed at the same time.

At 314, a top electrode of conductive material can be deposited on the dielectric stack. For example, the second electrode layer 118 of conductive material may be deposited or otherwise formed on the second dielectric layer 113. For example, the second electrode layer 118 may be deposited directly onto the second dielectric layer 113. The second electrode layer 118 can be formed of various materials including platinum, platinum alloy, iridium either solely or in combination with iridium oxide, ruthenium oxide, or SRO, any metal or conductive oxide, or any combination of these materials.

At 316, the preceding steps 304-314 can be repeated one or more times to achieve a multi-layer capacitor (MLC), including a MLC mirror substrate. Other processing can be applied to the capacitor structure, such as mesa patterning and etching. Patterning the capacitor layers into a mesa structure can provide access to all electrode layers and capacitor layers for later interconnection.

At 318, a final crystallization annealing can be performed, such as in an $O_2$ or $O_2$/carrier gas mixture. In one or more embodiments, the temperature of the final crystallization annealing can be the highest temperature in method 300 and can be selected to finalize RF and DC properties of the capacitor structure. At this stage, the dielectric stack can be fully densified. In one or more embodiments, the dielectric film of dielectric layers 113 resulting from method 300 can have randomly oriented grains with cubic symmetry. The homogeneity of the solution and static forces can result in symmetric para-electric phases that increase the tunability of the capacitor device relative to the vertical columnar structure of sputter-deposited film.

In one embodiment, the first and second dielectric layers 112, 113 can utilize a combination of an undoped BST and a doped BST formulation, or a combination of different ferroelectric materials to facilitate reducing space charge effects and/or improving a temperature dependence of the dielectric properties of the capacitor.

In one embodiment where the first electrode layer 114 is platinum, the hillock temperature for the platinum electrode layer can be selected to be 600 C and the first dielectric layer 112 can be sputtered at a first temperature at or below 600 C. Other temperatures can be selected so as to reduce or eliminate hillock formation depending on the type of materials being utilized and the deposition processes being employed. In one embodiment, the grain sizes of the first dielectric layer 112 can be smaller than the grain sizes of the second dielectric layer(s) 113, such as an average grain size of the first dielectric layer being smaller than an average grain size of the second dielectric layer(s).

In one embodiment, a planarizing and/or insulating layer can be deposited on top of the previously deposited layers, such as over the second electrode layer 118 or over the second dielectric layer 113. The planarizing and/or insulating layer can be etched to form a set of pathways or vias in the capacitor structure. These etched vias can provide conduits for metal interconnection materials to be deposited.

In one embodiment, such as following deposition and etching of the planarizing and/or insulating layer if such layer(s) are deposited, one or more metal interconnect layers can be deposited. The metal interconnect layer(s) can create electrical connections for the thin film capacitor.

In one embodiment, the electrodes can be patterned electrodes and the first and second dielectric layers 112, 113 can be formed on the patterned electrodes. For example, the electrode layer 114 can only partially cover the substrate 120 due to patterning of the electrode layer on the substrate. In one embodiment, the dielectric layer 112 can completely cover the patterned electrode layer.

In one embodiment following deposition of the metal interconnect layer, an additional layer of protective material, such as a silicon nitride overcoat, may be deposited on top of the metal interconnect layer and/or gold bumps may be attached to the metal connections to help protect the previously deposited structures.

Figure 4:
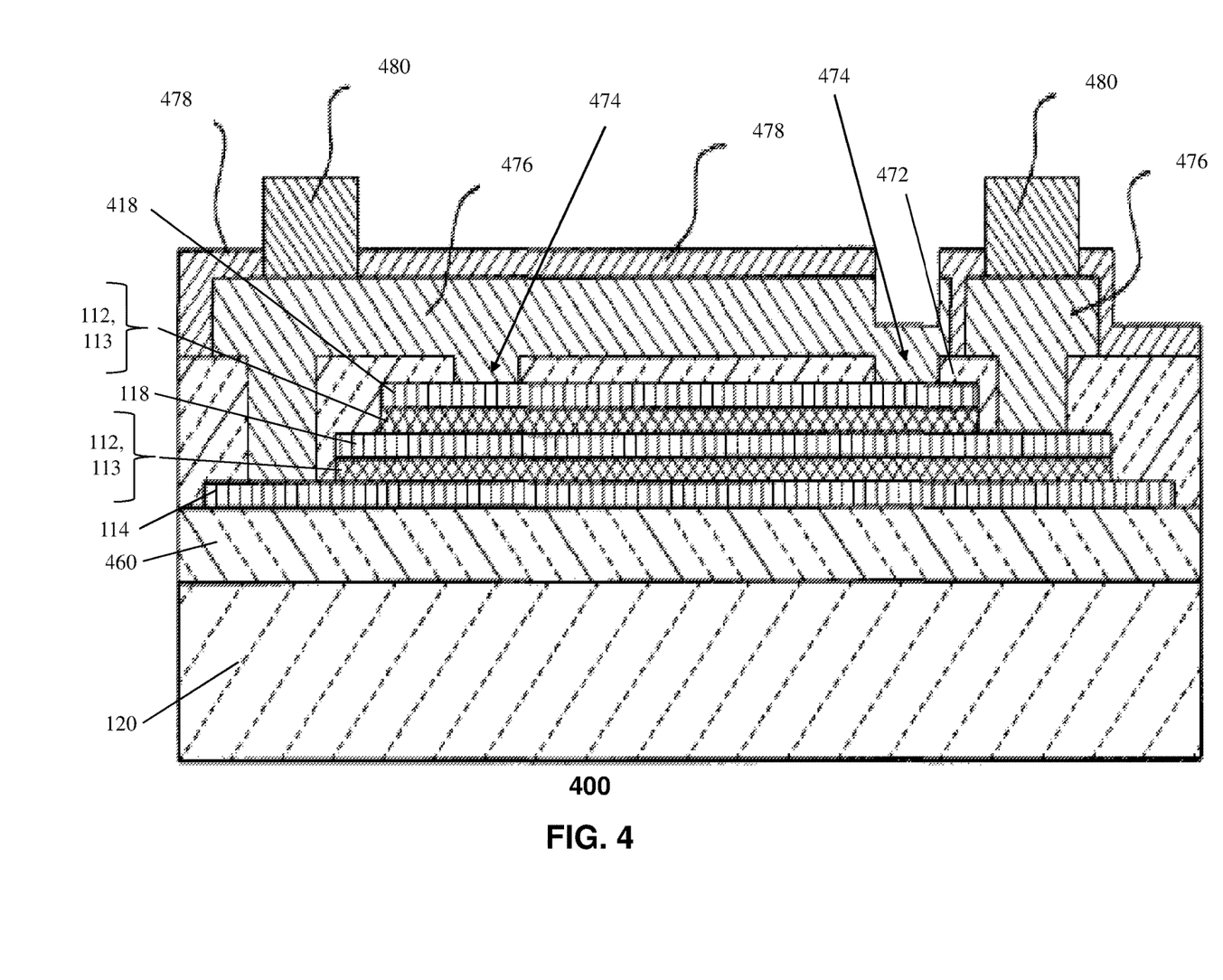
FIG. 4 illustrates another exemplary embodiment of a thin film capacitor having multiple dielectric layers.

FIG. 4 depicts a structure 400 that includes two sets of stacked dielectric layers, which in this example are dielectric layers 112, 113. Any number of sets of stacked dielectric layers 112, 113 can be utilized and various other connections can be implemented. In one embodiment, the dielectric layer 113 is a group of dielectric layers (e.g., formed according to method 300 and that have a random-oriented grain structure) deposited directly on dielectric layer 112 having columnar-oriented grains structures. The deposition process for the dielectric layer 112 and the dielectric layers 113 can be different, such as depositing the dielectric layer 112 at a low temperature which is below the temperature at which hillock formation occurs and depositing the dielectric layer 113 at a high temperature. Similar to the capacitor 200 of FIG. 2, the stacked capacitors in FIG. 4 can share a middle electrode 118.

In one embodiment, one or more insulating layers 460 are deposited on the substrate 120. The insulating layer(s) 460 may be formed from $SiO_2$ and/or $Si_3N_4$. The sets of dielectric layers 112, 113 and the electrode layers 114, 118, 418 are patterned to form a mesa structure, to facilitate providing an electrical connection to each electrode layer.

In one embodiment, a planarizing and insulating layer 472 (e.g., an ILD glass layer) can be deposited, patterned and etched to form vias 474. A metal interconnect layer 476 can be deposited over the planarizing and insulating layer 472 and into the vias 474 to provide an electrical connection to the electrodes 114, 118, 418. In one embodiment, a nitride overcoat 478 can be deposited to protect the metal interconnect layer 476 and gold bumps 480 can be deposited to provide electrical contacts for final packaging.

Upon reviewing the aforementioned embodiments, it would be evident to an artisan with ordinary skill in the art that said embodiments can be modified, reduced, or enhanced without departing from the scope of the claims described below. For example, an additional dielectric layer can be added to the group of dielectric layers while configuring the stacking such that at the interface with the electrodes the same or similar crystal grain structure is maintained and/or the same or similar dielectric composition exists. For instance, a stack can be formed which is configured as follows: a third dielectric layer having a columnar grain orientation deposited on the group of second dielectric layers 113 having the random grain orientation which are deposited on the first dielectric layer 112 having the columnar grain orientation. In this example, the same crystal grain structure (columnar) and the same dielectric composition (e.g., BST) exists at the top and bottom electrode interfaces. In addition it would be evident to an artisan of ordinary skill in the art that the temperature of the intermediate anneals 308 and final crystallization anneals 312 can be varied according to the final capacitor performance requirements and also can be present or absent at any step of the process 300.

In one or more embodiments, a sputtering target can be selected or fabricated (and utilized in one or more of the exemplary embodiments) according to one or more of the features or process steps of U.S. Patent Publication No. 20140216921, the disclosure of which is hereby incorporated by reference.

One or more of the thin film capacitors described with respect to the exemplary embodiments can be utilized in various components including tunable filters, voltage controlled oscillators, tunable phase shifters, tunable matching networks, low-impedance power supplies, decoupling high-frequency signals at an IC bonding pad, mobile phone components (where the mobile phone includes an antenna and a transceiver) or others. Integrated circuits including ferroelectric capacitors described with respect to the exemplary embodiments may, for example, be used in portable electronics for low-power wireless communication (e.g., cellular phones, pagers, PDAs, and so forth), directional antenna systems, high clock-rate microphones, miniature DC to DC converters, or other devices.

Other embodiments can be applied to the subject disclosure without departing from the scope of the claims described below.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A thin film capacitor comprising:
a substrate;
a first electrode layer on the substrate;
a first dielectric layer on the first electrode layer, wherein the first dielectric layer has a columnar-oriented grain structure;
a group of second dielectric layers stacked on the first dielectric layer, wherein the group of second dielectric layers is stacked directly on each other, wherein each of the group of second dielectric layers has a randomly-oriented grain structure, wherein at least one of the group of second dielectric layers is formed from a different material from at least one other of the group of second dielectric layers, and wherein an average grain size for the first dielectric layer is different than an average grain size for each of the group of second dielectric layers; and
a second electrode layer on the group of second dielectric layers,
wherein the average grain size for the first dielectric layer is smaller than the average grain size for each of the group of second dielectric layers.

2. The thin film capacitor of claim 1, wherein the first dielectric layer and at least one of the group of second dielectric layers are each a high density dielectric layer that comprises barium strontium titanate.

3. The thin film capacitor of claim 1, wherein the first dielectric layer is formed from a different material from at least one of the group of second dielectric layers.

4. The thin film capacitor of claim 1, wherein the first dielectric layer is between 50 to 500 Angstroms thick, and wherein the group of second dielectric layers has a total thickness between 500 to 50,000 Angstroms, wherein the first electrode layer, the first dielectric layer, the group of second dielectric layers, and the second electrode layer are part of a first capacitor of a multi-stack capacitor that includes a second capacitor having another first dielectric layer, another group of second dielectric layers, and another second electrode layer.

5. The thin film capacitor of claim 4, wherein the multi-stack capacitor has a mesa structure.

6. The thin film capacitor of claim 1, further comprising a planarizing and insulating layer over the group of second dielectric layers.

7. The thin film capacitor of claim 6, further comprising vias etched through the planarizing and insulating layer.

8. A thin film capacitor comprising:
a substrate;
a first electrode layer on the substrate;
a first dielectric layer on the first electrode layer, wherein the first dielectric layer has a columnar-oriented grain structure;
a group of second dielectric layers stacked on the first dielectric layer, wherein the group of second dielectric layers is stacked directly on each other, wherein each of the group of second dielectric layers has a randomly-oriented grain structure, and wherein the first dielectric layer and at least one of the group of second dielectric layers comprises barium strontium titanate; and a second electrode layer on the group of second dielectric layers, wherein an average grain size for the first dielectric layer is smaller than an average grain size for each of the group of second dielectric layers.

9. The thin film capacitor of claim 8, wherein the first dielectric layer is between 50 to 500 Angstroms thick, and wherein the group of second dielectric layers has a total thickness between 500 to 50,000 Angstroms, wherein the first electrode layer, the first dielectric layer, the group of second dielectric layers, and the second electrode layer are part of a first capacitor of a multi-stack capacitor that includes a second capacitor having another first dielectric layer, another group of second dielectric layers, and another second electrode layer.

10. A thin film capacitor comprising:
a substrate;
a first electrode layer on the substrate;
a first dielectric layer on the first electrode layer, wherein the first dielectric layer has a columnar-oriented grain structure;
a group of second dielectric layers stacked on the first dielectric layer, wherein the group of second dielectric layers is stacked directly on each other, wherein each of the group of second dielectric layers has a randomly-oriented grain structure, wherein an average grain size for the first dielectric layer is smaller than an average grain size for each of the group of second dielectric layers; and a second electrode layer on the group of second dielectric layers, wherein a thickness of the first dielectric layer is different than a thickness of each of the group of second dielectric layers.

11. The thin film capacitor of claim 10, wherein the first dielectric layer is between 50 to 500 Angstroms thick.

12. The thin film capacitor of claim 10, wherein the group of second dielectric layers has a total thickness between 500 to 50,000 Angstroms.

13. The thin film capacitor of claim 10, wherein the first dielectric layer is formed from a different material from at least one of the group of second dielectric layers.

14. The thin film capacitor of claim 10, wherein the first electrode layer, the first dielectric layer, the group of second dielectric layers, and the second electrode layer are part of a first capacitor of a multi-stack capacitor that includes a second capacitor having another first dielectric layer, another group of second dielectric layers, and another second electrode layer.

15. The thin film capacitor of claim 14, wherein the multi-stack capacitor has a mesa structure.

16. The thin film capacitor of claim 10, further comprising a planarizing and insulating layer over the group of second dielectric layers.

17. The thin film capacitor of claim 16, further comprising vias etched through the planarizing and insulating layer.

18. The thin film capacitor of claim 10, wherein the first dielectric layer and at least one of the group of second dielectric layers comprise barium strontium titanate.

* * * * *